United States Patent [19]

Kimyacioglu et al.

[11] Patent Number: 5,446,412
[45] Date of Patent: Aug. 29, 1995

[54] CONTINUOUSLY LINEAR PULSE AMPLIFIER/LINE DRIVER WITH LARGE OUTPUT SWING

[75] Inventors: M. Kursat Kimyacioglu, Mountain View; Ismail H. Ozguc, Sunnyvale, both of Calif.

[73] Assignee: Exar Corporation, San Jose, Calif.

[21] Appl. No.: 246,059

[22] Filed: May 19, 1994

[51] Int. Cl.[6] .............................................. H03F 3/45
[52] U.S. Cl. ..................................... 330/285; 330/253; 330/260; 330/261; 330/311
[58] Field of Search ................ 330/255, 260, 310, 311, 330/253, 261

[56] References Cited

U.S. PATENT DOCUMENTS

| | | | |
|---|---|---|---|
| 4,668,919 | 5/1987 | de Weck | 330/255 X |
| 4,758,799 | 7/1988 | Ho et al. | 330/311 |
| 5,166,635 | 11/1992 | Shih | 330/255 X |
| 5,285,168 | 2/1994 | Tomatsu et al. | 330/253 |

Primary Examiner—James B. Mullins
Attorney, Agent, or Firm—Townsend and Townsend Khourie and Crew

[57] ABSTRACT

A transmission line driver circuit for use in data communication transmitters that is capable of meeting the return loss specifications as well as the electrical interface specifications as defined by C.C.I.T.T. standards for E1/T1 transmission. The line driver circuit of the present invention maintains minimum output impedance during the entire dynamic range of the transmit signal while meeting the pulse shape template requirements. The circuit includes a predriver stage that controls the slew rate of the transmit signal within the constraints of the pulse template. This allows a subsequent output driver stage to enjoy fast slew rates, large gain and dynamic range, and very small output impedance to meet the return loss specification.

11 Claims, 4 Drawing Sheets

CONTINUOUSLY LINEAR PULSE AMPLIFIER/LINE DRIVER WITH LARGE OUTPUT SWING

BACKGROUND OF THE INVENTION

The present invention relates in general to data communication circuits, and in particular to a pulse amplifier/line driver circuit for driving digital transmission lines.

Designing a data communication transmitter to drive E1 or T1 digital transmission lines that meets both the required electrical interface specifications as well as the return loss specifications has proved to be a challenging task. The electrical interface and return loss specifications are governed by C.C.I.T.T. standards G.703 and G.775, respectively. On the transmitter side, the electrical interface specifications dictate the amplitude, speed and the shape of the transmit signal, while the return loss specifications dictate the degree of impedance matching between the driver and the load.

FIG. 4 shows the template defining the transmit signal pulse shape for E1 transmission according to C.C.I.T.T. G.703 standards. Lines 400 and 402 define the template for a positive transmit pulse 401, while lines 404 and 406 define the template for a negative transmit pulse 405. The template shown in FIG. 4 sets an absolute minimum slew rate of about 30 v/μsec. for E1/T1 transmit pulses. Typical E1/T1 line driver circuits, however, exhibit slew rates closer to 100 to 120 v/μsec. Generally, the slew rate for a particular transmission system depends on the associated template and can be expressed in terms of peak voltage and the data rate as follows:

Slew Rate $= K$ (Vpeak $\div 1/f_0$)

where $f_0$ is the data rate (e.g., 2 Mbits/sec. for E1), Vpeak is the peak voltage defined by the template, and K is a proportionality constant. The constant K is dependent on the pulse shape and template characteristics. Some typical values for K are 1 for non-return to zero (NRZ) data and 2 for return to zero (RZ) data such as E1 and T1 data.

Return loss generally refers to the amount by which the undesired return (or reflected) transmit signal is attenuated. The C.C.I.T.T. G.775 require 10 dB return loss in the frequency range from 50 KHz to 1.024 MHz, 14 dB return loss in the frequency range from 1.024 MHz to 2.048 MHz, and 12 dB return loss in the frequency range from 2.048 MHz to 3.076 MHz. Signal reflection occurs when the transmission line is not properly terminated or driven. That is, to minimize signal reflection, the transmission line must be driven and terminated with an impedance that matches the characteristic impedance of the line. Return loss specifications thus require good matching between the impedance of the driver and the load.

The above electrical interface and return loss specifications lead to several conflicting requirements and conditions. On the one hand, to maximize return loss, the output impedance of the driver inside the transmitter must be minimized. This is required to minimize the adverse affects the driver output impedance will have on the required impedance matching. On the other hand, the electrical interface specifications, or the template that defines the shape of the transmit pulses, require very fast rise and fall times. This translates to very fast positive and negative slew rate requirements for the driver circuit. In most instances, however, even a fast driver runs into slew rate limitations in the presence of fast enough input signals. When the driver experiences slew rate limiting, the driver output is not capable of following the input, and the feedback path around the driver is temporarily broken. With no feedback, the effective output impedance of the driver is no longer reduced by the gain of the driver stage. Thus, the driver exhibits large output impedance during slewing. Another condition under which the driver may exhibit large output impedance is when there are no input pulses (i.e., when the input is at ground or binary-zeros are transmitted in AMI coded signals). If the driver is designed such that its output devices shut off in the absence of an input pulse, the output will turn into a high impedance node. To maintain the output voltage at zero volts in the absence of input pulses, one approach employs an auxiliary set of output devices connected in parallel with the main output devices. The parallel output path is then allowed to draw a small amount of current to force the output voltage to zero. The auxiliary devices, however, are usually much weaker and smaller than the main output devices. As a result, the output impedance is high even if the feedback loop is intact. Large driver output impedance in turn disturbs the impedance matching of the line and reduces transmit signal return loss.

Another factor affecting the design of the driver is signal amplitude requirements. The minimum required amplitude for the transmit signal at the end of the transmission line is set at ±3.0 volts on twisted pair wire and ±2.37 volts on coaxial cables in T1/E1 data transmission. This translates to rail-to-rail voltage swing requirements at the output of the driver. A driver with large output swings typically requires large dynamic range and gain/bandwidth. This usually results in large current requirements and therefore faster amplifiers. While the signal amplitude and rise/fall time requirements point toward designing a very fast driver, noise consideration dictate otherwise. Generating a transmit signal with sharp transitions gives rise to higher harmonics in the frequency spectrum. The high frequency side lobes increase crosstalk noise and electromagnetic interference. Sharp signal edges also increase the possibility of overshoot and ringing which may cause deviations in the shape of the transmit signal from the specified template. Further, variations in temperature and integrated circuit processing cause variations in the speed of the driver stage. Changes in speed of the driver in turn create template matching problems.

There is, therefore, a need in data communication systems for a driver circuit that is capable of meeting the return loss requirements as well as the electrical interface specifications.

SUMMARY OF THE INVENTION

The present invention provides a transmission line driver circuit that exhibits large output swings, and meets the rise/fall time requirements of the transmit signal template while maintaining minimum output impedance during the entire signal pulse shape. The line driver circuit of the present invention includes a feedback loop to reduce output impedance. The feedback loop is maintained even when the driver output experiences nearly rail to rail swings.

Broadly, the line driver circuit of the present invention includes a pre-driver stage that deliberately slews an output driver, but within the constraints of the pulse template. This limits the slew rate of the input signal to the output driver that is designed to have large output swing, large dynamic range and low output impedance. The limited slew rate of the signal at the input, prevents the feedback loop around the output driver from breaking during signal transitions. Thus, the output driver maintains low output impedance during signal transitions as well as flats. The limited slew rate also suppresses high frequency lobes in the frequency spectrum which reduces near end crosstalk once the line carrying this signal is bundled with others.

Accordingly, in one embodiment, the present invention provides in a data communication system, a transmission line driver circuit that includes a pre-driver stage having limited slewing capability at its output, and an output driver with an input for receipt of the output of the pre-driver, and an output for driving the transmission line. The output driver is designed to have large output swings and minimum output impedance.

A better understanding of the nature and advantages of the line driver circuit of the present invention may be had with reference to the detailed description and drawings below.

DESCRIPTION OF THE SPECIFIC EMBODIMENTS

Figure 1:
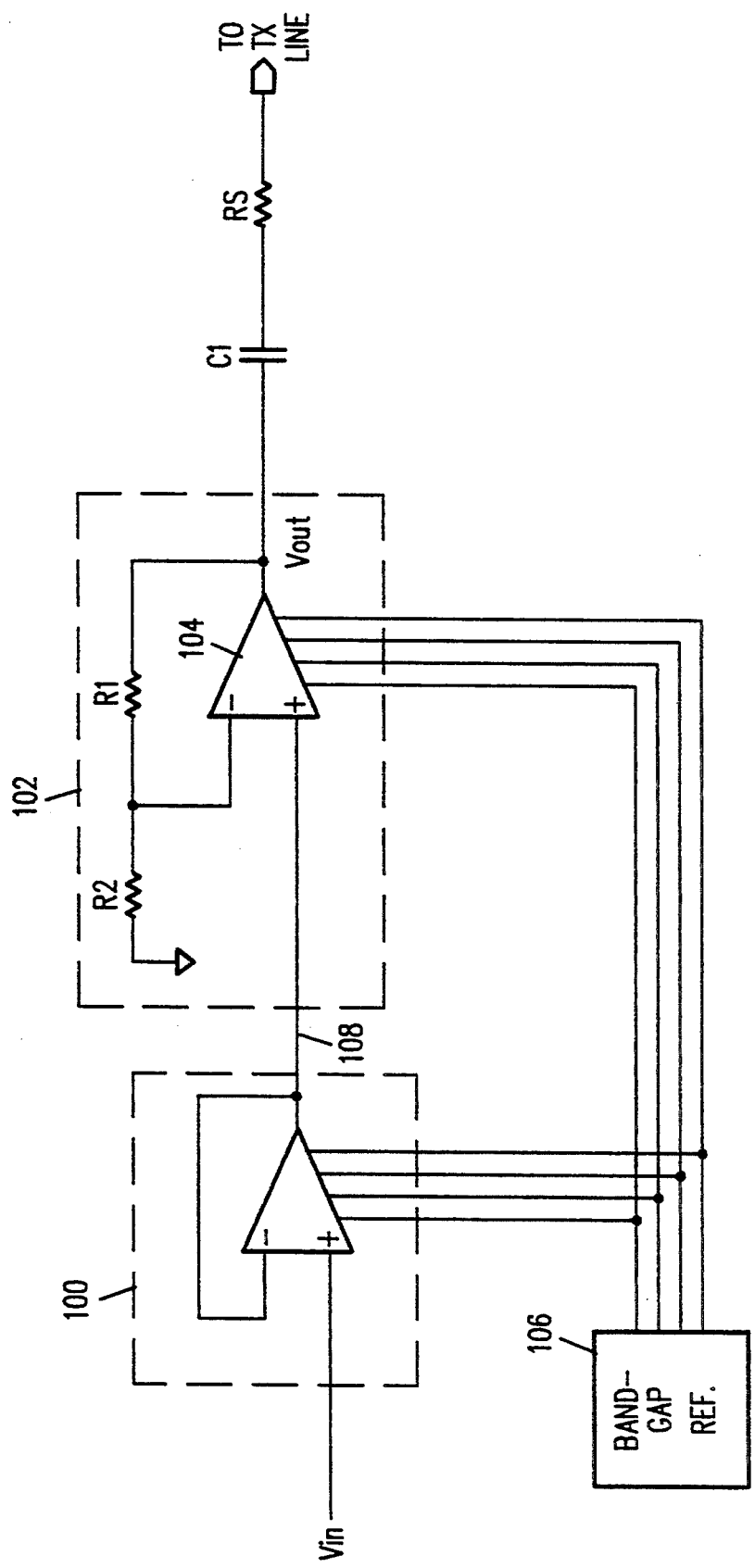
FIG. 1 is a circuit schematic of the line driver circuit according to one embodiment of the present invention.

FIG. 1 shows a specific embodiment of the line driver circuit according to the present invention. instead of attempting to realize the speed and output impedance requirements using a single amplifier stage, the circuit of the present invention divides the circuit into two stages. A first, pre-driver stage 100 receives the transmit signal at its input Vin. Pre-driver 100 is a differential amplifier that is connected in a unity gain configuration. The output of pre-driver 100 (node 108) connects to the positive input of an output driver 102. Output driver 102 is made up of a differential amplifier 104 which has a feedback resistor R1 connecting its output to the negative input. Another resistor R2 connects the negative input of differential amplifier 104 to ground. Resistors R1 and R2 set the closed loop gain of output driver 102. Both pre-driver 100 and output driver 102 are biased using a bandgap reference circuit 106. The output Vout of output driver 102 drives the transmission line through a coupling capacitor C1 and a matching resistor Rs.

Figure 2:
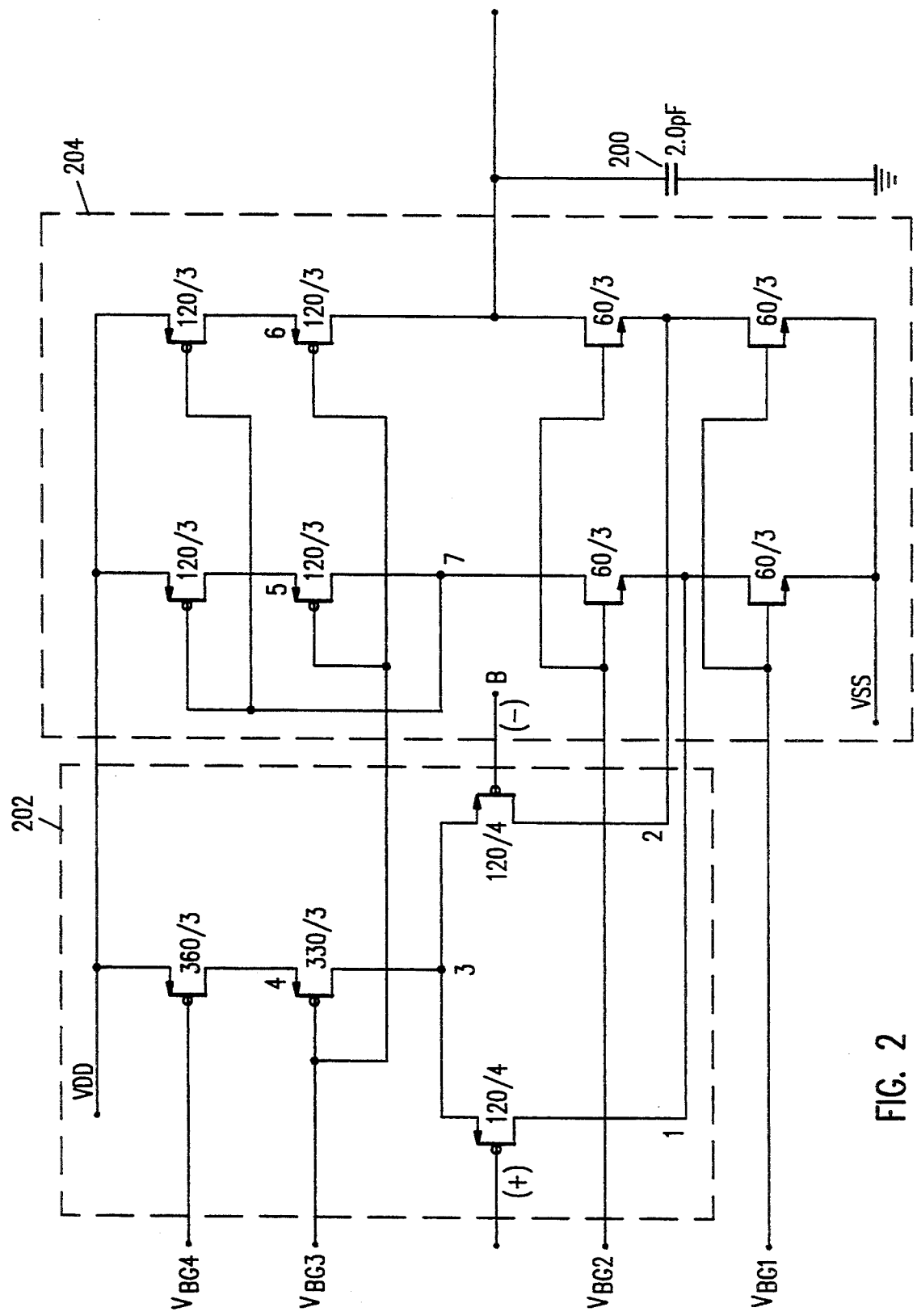
FIG. 2 is a circuit schematic of an exemplary differential amplifier for use as a pre-driver for the line driver circuit of the present invention.

Pre-driver 100 is designed to have a relatively slow slew rate. The E1 template, for example, requires a slew rate of approximately 120 v/μsec. Pre-driver 100 can be designed to have a slew rate of, for example, 100 v/μsec. for use in an E1 system. The required slew rate varies for the various transmission system types (e.g., E1, T1, T3, NRZ, RZ, etc.). The upper limit for the slew rate of pre-driver 100 can be obtained by using the above slew rate equation for a given transmission system. A typical folded cascode differential amplifier can be used for pre-driver 100. FIG. 2 shows an exemplary circuit schematic for a folded cascode differential amplifier. As is typical in folded cascode designs, the amplifier is frequency compensated using a load capacitor 200. The slew rate for this amplifier is set by the amount of current that charges the compensation capacitor 200. This current is set by adjusting the reference signals $V_{BG1}$, $V_{BG2}$, $V_{BG3}$ and $V_{BG4}$ applied to a differential stage 202 and a second stage 204 of the differential amplifier. The currents and the size of compensation capacitor 200 in the example shown are designed to yield an exemplary slew rate of approximately 100 v/μsec.

Referring back to FIG. 1, the output 108 of pre-driver 100 connects to the positive input of differential amplifier 104. The closed loop gain of output driver 102 is given by [1+R1/R2]. Thus, given a signal amplitude at the output of pre-driver 100 of around for example ±2.0 volts, to obtain ±4.5 volts at Vout, the sizes of R1 and R2 are chosen for a gain of approximately 2.25. The internal circuitry of amplifier 104 is designed such that its output can comfortably swing to within 0.5 volts of the supply voltages (i.e., ±4.5 volts). The amplifier is also designed to exhibit an output impedance as low as 1 to 2 ohms during the entire pulse shape of the output signal. Further, the slew rate for amplifier 104 is set to be much faster than pre-driver 100. For an E1 transmission system, amplifier 104 may have an exemplary slew rate of about 200 v/μsec.

In operation, due to slew rate limiting, pre-driver 100 slows down the rise and fall times of the transmit pulse at its output 108. Pre-driver 100 is, however, fast enough to ensure that the signal edges remain within the pulse template. This results in smoother rising and falling edges for the transmit signal which reduces the undesirable side lobes in the frequency spectrum. Output driver 102 is designed with fast slewing capability and excess bandwidth to be able to follow the slewed input signal. Without slewing of the input signal, output driver 102 would not be able to follow the input and therefore the feedback loop would break, causing high impedance at the output. The output transistors in differential amplifier 104 are designed to be large to minimize the output impedance when the output is operating close to the supply voltages. Because output driver 102 is made much faster than pre-driver 100, output driver 102 does not experience slew limiting during signal transitions and thus the feedback around it remains intact. Minimum output impedance is therefore maintained during signal transitions.

Figure 3:
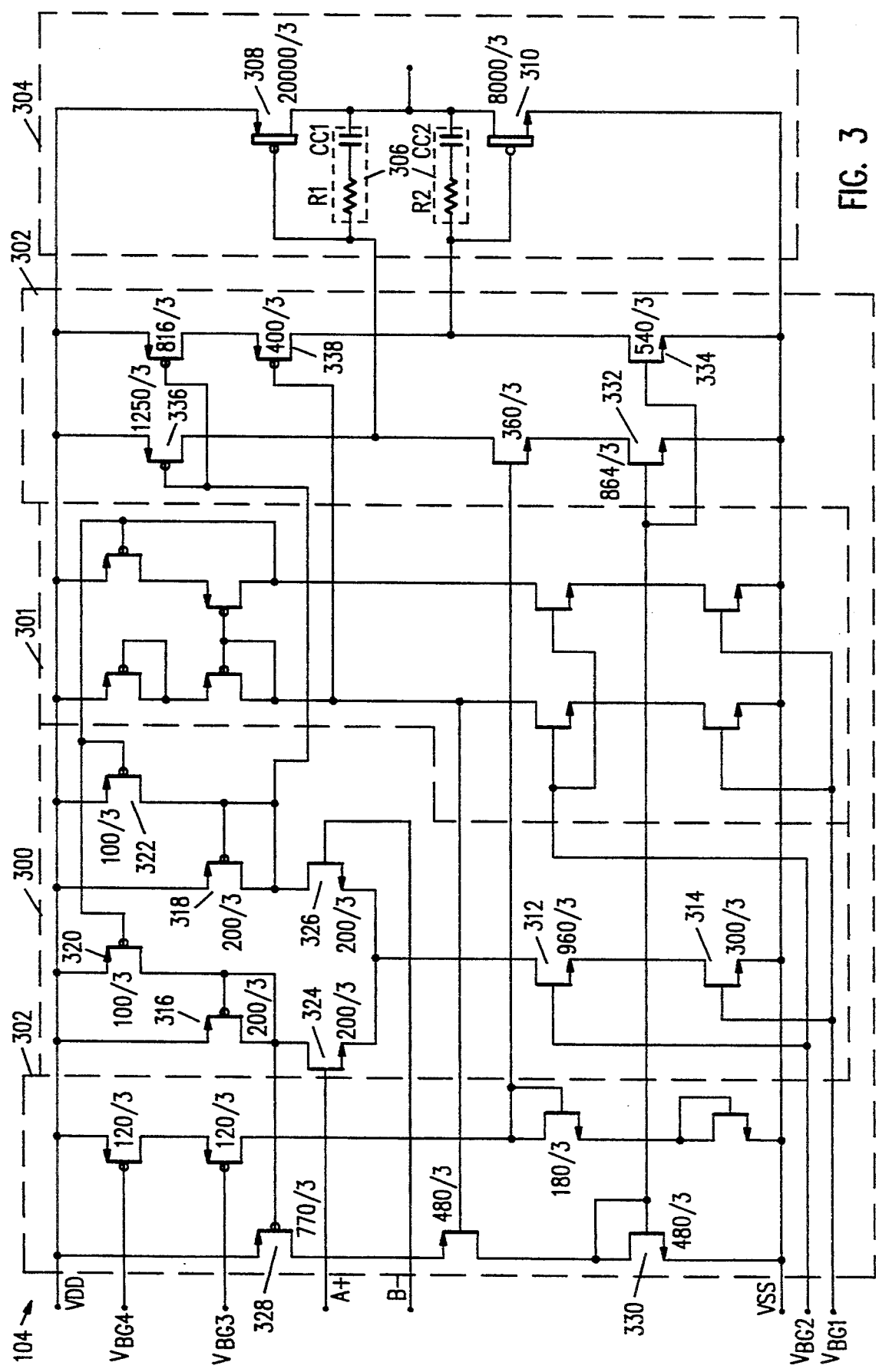
FIG. 3 is a circuit schematic of a differential amplifier for use as an output driver for the line driver circuit of the present invention.
Figure 4:
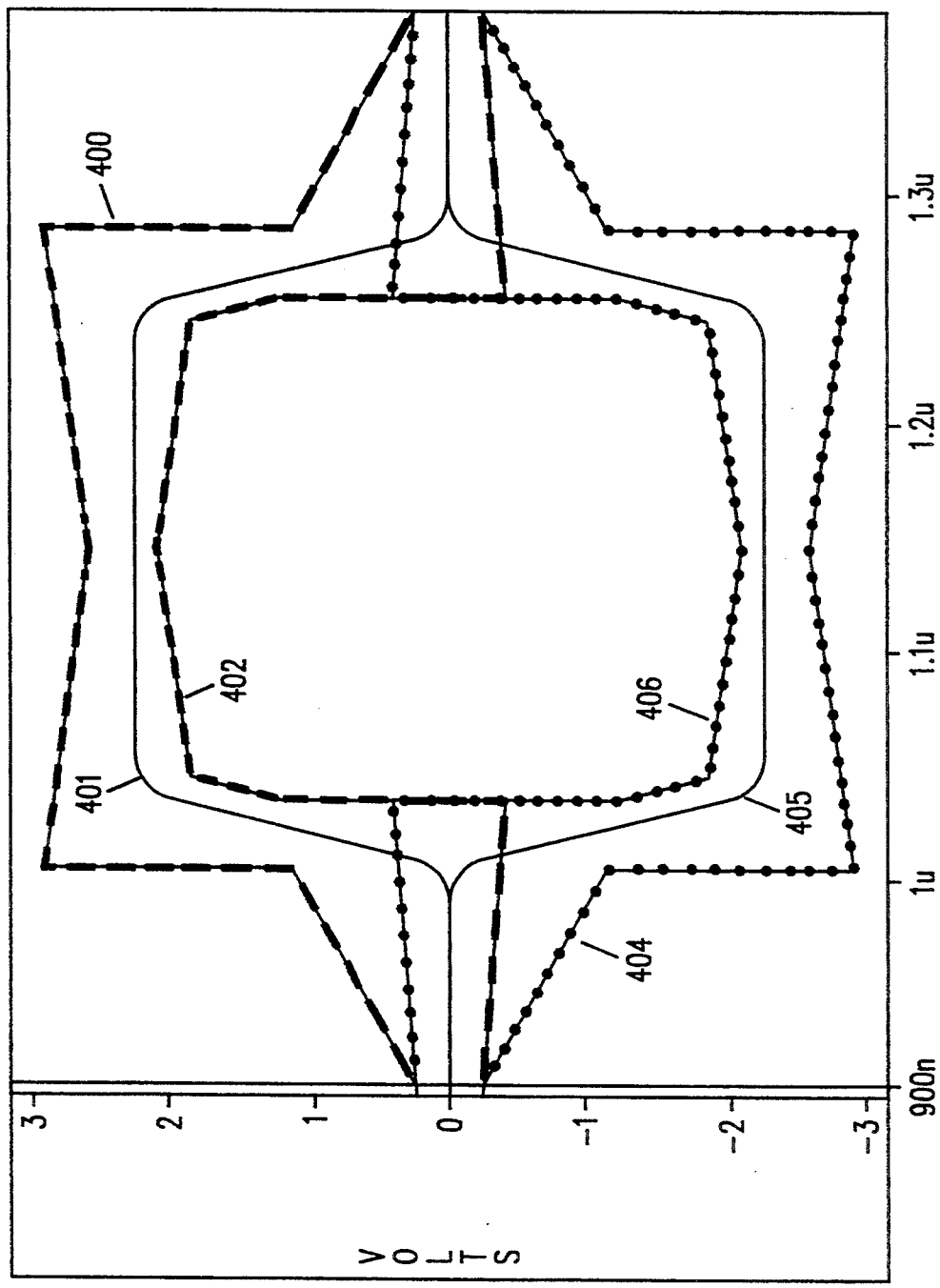
FIG. 4 shows a template defining a pulse shape of the transmit signal according to C.C.I.T.T. G.703 standards.

FIG. 3 is a circuit schematic of differential amplifier 104. Differential amplifier 104 includes three stages: a first differential input stage 300, a second high-gain cascode stage 302, and a final push-pull output stage 304. Frequency compensation is provided by series connected resistor/capacitor 306 (miller compensation) across push-pull output transistors 308 and 310. To provide for adequate phase margin for a given closed loop gain, another compensation capacitor may be added between the output Vout and the negative input of the amplifier. There is also a biasing stage 301 that receives signals from the bandgap reference and sets up the quiescent currents for the various stages of the amplifier. Differential amplifier 104 is designed with an open loop DC gain having an exemplary value of approximately 50 dB. Exemplary values for the gain-bandwidth product and input referred common mode range for differential amplifier 104 are 35 MegHz and ±3.5 volts, respectively.

The amount of current in differential input stage 300 is set by bandgap reference voltages $V_{BG1}$ and $V_{BG2}$ connecting to the gate terminals of current source devices 312 and 314. This current may be set to, for example, approximately 1 mA. When there are no input pulses, this current is divided equally between the differential legs of stage 300. However, when slewing, almost all of this current flows through one leg, for example, the positive input transistor 324. Transistors 320 and 322 connecting to the load transistors 316 and 318 operate to improve the slew rate performance of the amplifier. Transistors 320 and 322 are designed to draw a fixed amount of current, for example, 200 μA. In the absence of an input pulse, the 500 μA (half of the input stage current) is divided between the diode connected load transistors 316/318 and transistors 320/322 (i.e., 300 μA/200 μA). The current through diode connected load transistor 316 is mirrored and multiplied into second stage 302 by transistor 328. Thus, by diverting about 200 μA from the load devices, the quiescent current mirrored to the succeeding stages is reduced. However, when an input pulse arrives and if the input stage is allowed to slew, the entire 1 mA flows through one leg of the differential pair. Since the current through transistors 320/322 is fixed (200 μA), the additional 500 μA flows through, for example, diode connected load transistor 316. Thus, during slewing, the current that is mirrored to the succeeding stages is increased by the full 500 μA. In the example shown in FIG. 3, this current is multiplied by a factor of about four by transistor 328 and mirrored into second stage 302 via transistors 330, 332, and 324. Thus, instantaneous large currents charge the compensation capacitors during signal transitions to obtain fast slew rate.

Output transistors 308 and 310 are designed with very large channel width to channel length ratios to maximize gain and minimize output impedance. In the example shown in FIG. 3, P-channel pull-up transistor 308 has a W/L ratio as large as 20000μ/3μ, while N-channel pull-down transistor 310 has a W/L ratio of 8000μ/3μ. Such large transistor sizes reduce the output impedance to as low as 1 to 2 ohms. The push-pull nature of output stage 304 allows the output Vout to swing within 0.5 volts of the supply voltages (i.e., ±4.5 volts). When the output signal is at its peaks, the output devices may go into linear (or triode) operating region. However, the feedback around the amplifier keeps the output impedance low. This ensures a low output impedance not only during the signal transitions, but also during signal peaks (i.e., during the entire pulse shape). The transistor sizes for all devices including current source devices (e.g., 312, 314, 332, 334) and amplifying devices (e.g., 324, 326, 336, 338) are designed such that for the given bandgap reference voltages, the quiescent current in the amplifier is set up to allow a small amount of current (e.g., 1–2 mA) to flow through output transistors 308 and 310 when the input is at zero volts. This forces the output voltage to zero while maintaining low output impedance. Thus, output driver 102 remains continuously linear during the entire pulse shape of the transmit signal (i.e., from 0 volts to within 0.5 volts of either supply).

The cascode current source structure in differential input stage 300 as well as second stage 302 provide for improved power supply rejection ratio. The higher output impedance of the cascode structure also improves the common mode rejection ratio of the amplifier.

Finally, the use of bandgap reference circuit 106 (FIG. 1) to supply the bias voltages for pre-driver 100 and output driver 104 provides for a high degree of temperature independence. The use of bandgap reference circuit 106 to bias pre-driver 100 is particularly critical in the two-stage design of the present invention. This is so because output driver 104 relies on an input signal with a well-controlled slew rate. Variations in the biasing current of pre-driver 100 due to temperature fluctuations, and thus changes in the slew rate are minimized by the use of bandgap reference circuit 106.

In conclusion, the present invention provides for a transmission line driver circuit for use in data communication transmitters that is capable of meeting the return loss specifications as well as the electrical interface specifications as defined by C.C.I.T.T. standards for T1/E1 transmission. The line driver circuit of the present invention maintains minimum output impedance during the entire dynamic range of the transmit signal while meeting the pulse shape template requirements. The line driver circuit includes a pre-driver stage that controls the slew rate of the transmit signal. This allows a subsequent output driver stage to enjoy fast slew rates, larger gain and dynamic range, and very small output impedance to meet the return loss requirements. It is to be understood that the present invention is not limited to T1/E1 transmission, and that the basic inventive concept can be employed in all types of digital transmission.

While the above is a complete description of a specific embodiment of the present invention, it is possible to use various alternatives, modifications and equivalents. For example, there are numerous alternatives to the described differential amplifier circuits used in the pre-driver stage as well as the output driver stage. Therefore, the scope of the present invention should be determined not with reference to the above description but should, instead, be determined with reference to the appended claims, along with their full scope of equivalents.

What is claimed is:

1. A transmission line driver circuit comprising:
   a unity-gain-coupled predriver stage having an input for receipt of a transmit signal and an output, said predriver stage comprising:
      a differential input stage having a positive input and a negative input coupled to said input and output of said predriver stage, respectively, said differential input stage further comprising cascode current source devices,
      a folded cascode second stage coupled to said differential input stage, said folded cascode second stage having an output coupled to said output of said predriver stage and said negative input of said differential input stage, and
      a capacitor coupled to said output of said folded cascode second stage;
   an output driver amplifier comprising:
      a differential input stage having a first input coupled to said output of said predriver stage, and a second input, said differential input stage comprising a pair of input transistors coupled between a current source and a pair of load transistors, a differential cascode second stage coupled to outputs of said differential input stage, a push-pull output stage having substantially large pull-up transistor and pull-down transistor driving an output of the line driver circuit, and compensation capacitors coupled across said pull-up and pull-down transistors, a slew-boosting circuit coupled to said pair of load transistors of said differential input stage and said second cascode stage, said slew-boosting circuit for boosting an amount of current charging said compensation capacitors when said differential input stage is slewing, and a bias stage for setting up biasing of said differential input stage and said differential cascode second stage; and a resistive feedback network coupled to said output of the line driver circuit and said second input of said output driver amplifier, for setting a closed loop gain of said output driver amplifier, wherein, said unity-gain-coupled predriver has a controlled slew rate slower than said output driver amplifier.

2. The transmission line driver of circuit of claim 1 wherein said bias stage forces a substantially small amount of current to flow through said pull-up and pull-down transistors when said transmit signal is at zero volts.

3. The transmission line driver circuit of claim 2 wherein said substantially small amount of current is about 1 mA.

4. The transmission line driver circuit of claim 2 wherein said slew-boosting circuit comprises a pair of transistors coupled to said bias stage and said pair of load transistors, said pair of transistors for injecting current to said pair of load transistors when said differential input stage is slewing.

5. The transmission line driver circuit of claim 4 further comprising a bandgap reference circuit coupled to said predriver stage and said output driver amplifier, said bandgap reference circuit providing stable biasing conditions for said predriver stage and said output amplifier.

6. The transmission line driver circuit of claim 5 wherein a slew rate of said predriver stage is less than that of said output driver amplifier such that an output impedance of said output driver amplifier is maintained at less than 5 ohms during rise and fall of the transmit signal.

7. The transmission line driver circuit of claim 6 wherein said slew rate of said predriver stage is about 100 v/$\mu$sec and said slew rate for said output driver amplifier is about 200 v/$\mu$sec.

8. The transmission line driver circuit of claim 5 wherein said output driver amplifier is capable of rail-to-rail output voltage swing under feedback conditions, whereby low output impedance is maintained even when said pull-up and pull-down transistors are driven into triode region of operation.

9. A transmission line driver circuit comprising:

a unity-gain-coupled predriver differential amplifier having an input coupled to an input of the transmission line driver circuit, and an output, said unity-gain-coupled predriver differential amplifier having a limited slew rate;

an output driver amplifier having a first input coupled to said output of said unity-gain-coupled predriver differential amplifier and a second input, said output driver amplifier comprising:

a differential input stage having a first input transistor with a control terminal coupled to said first input, a second input transistor with a control terminal coupled to said second input, a pair of cascode current source transistors coupled to said first and second input transistors, and first and second diode-connected load transistors, respectively coupled to said first and second input transistors, a bias circuit coupled to a reference voltage, first and second slew-boosting transistors coupled to said first and second diode-connected load transistors, respectively, said first and second slew-boosting transistors having control terminals coupled to said bias circuit, a differential cascode second stage having a first cascode leg coupled to said first diode-connected load transistor and said bias circuit, and a second cascode leg coupled to said second diode-connected load transistor and said bias circuit, a substantially large pull-up transistor coupled to said first cascode leg, and having a first compensation capacitor coupled thereacross, and a substantially large pull-down transistor coupled to said second cascode leg, and having a second compensation capacitor coupled thereacross, wherein, said pull-up transistor couples to said pull-down transistor at an output of said output driver amplifier, and wherein said first and second slew-boosting transistors provide additional charge current for said first and second compensation capacitors when said output driver amplifier is slewing; and a resistive feedback network coupled between said output of said output driver amplifier and said second input of said output driver amplifier, wherein, said limited slew rate of said unity-gain-coupled predriver differential amplifier is less than a slew rate of said output driver amplifier.

10. The transmission line driver circuit of claim 9 wherein said bias circuit forces a substantially small amount of current to flow through said pull-up and pull-down transistors when said input of said transmission line driver circuit is at zero volts.

11. The transmission line driver circuit of claim 10 further comprising a bandgap reference circuit providing said reference voltage.

* * * * *